(12) United States Patent
Wen

(10) Patent No.: US 12,296,651 B2
(45) Date of Patent: May 13, 2025

(54) COOLING SYSTEM FOR ELECTRIC VEHICLE ADAPTED FOR COOLING OF COMPONENTS OF VEHICLE

(71) Applicant: Fulian Precision Electronics (Tianjin) Co., LTD., Tianjin (CN)

(72) Inventor: Shao-Yi Wen, Houston, TX (US)

(73) Assignee: Fulian Precision Electronics (Tianjin) Co., LTD., Tianjin (CN)

( * ) Notice: Subject to any disclaimer, the term of this patent is extended or adjusted under 35 U.S.C. 154(b) by 310 days.

(21) Appl. No.: 17/752,032

(22) Filed: May 24, 2022

(65) Prior Publication Data

US 2023/0150341 A1     May 18, 2023

(30) Foreign Application Priority Data

Nov. 12, 2021   (CN) .......................... 202111341484.2

(51) Int. Cl.
| | |
|---|---|
| *B60H 1/32* | (2006.01) |
| *B60H 1/00* | (2006.01) |
| *F25B 5/02* | (2006.01) |
| *H05K 7/20* | (2006.01) |

(52) U.S. Cl.
CPC ..... *B60H 1/32281* (2019.05); *B60H 1/00271* (2013.01); *B60H 1/00392* (2013.01); *H05K 7/20881* (2013.01); *B60H 2001/00307* (2013.01); *F25B 5/02* (2013.01)

(58) Field of Classification Search
CPC ............ B60H 1/00271; B60H 1/00278; H05K 7/20881; H05K 7/20936; H05K 5/0209–0212; F25B 43/003
See application file for complete search history.

(56) References Cited

U.S. PATENT DOCUMENTS

| | | | | |
|---|---|---|---|---|
| 4,720,981 | A * | 1/1988 | Helt .................... | H05K 7/20936 165/80.4 |
| 5,220,809 | A * | 6/1993 | Voss .......................... | F25B 5/02 165/80.4 |
| 5,402,655 | A * | 4/1995 | Mangyo ................ | F25B 43/003 62/474 |

(Continued)

FOREIGN PATENT DOCUMENTS

| | | |
|---|---|---|
| CN | 104180581 B | 6/2016 |
| CN | 108987849 A | 12/2018 |

(Continued)

*Primary Examiner* — Christopher R Zerphey
(74) *Attorney, Agent, or Firm* — ScienBiziP, P.C.

(57) ABSTRACT

A cooling system includes a cooling loop, a cooling branch, and a refrigerant. The cooling loop includes a condenser, a first valve, an evaporator, and a compressor etc. connected to form a loop. The cooling branch is configured in parallel with the evaporator, the cooling branch includes a cooling unit with thermal contact with one or more to-be-cooled components through a thermal interfacial material. The refrigerant flows through the cooling unit with a phase change process to cool components and the flow rate is optimized for energy efficiency purpose. A traditional cooling branch featured by heat exchanger & pump with a separate coolant is not required, which reduces the cost, improves the space utilization and boosts efficient cooling of components in e-vehicles, especially autonomous ones, with sufficient cooling capability and minimized cooling delay.

6 Claims, 4 Drawing Sheets

(56) References Cited

U.S. PATENT DOCUMENTS

| | | | | |
|---|---|---|---|---|
| 5,435,145 | A * | 7/1995 | Jaster | F25B 41/347 251/129.05 |
| 5,477,701 | A * | 12/1995 | Kenyon | F25B 41/345 62/210 |
| 6,144,013 | A * | 11/2000 | Chu | H05K 5/0212 392/416 |
| 6,840,050 | B2 * | 1/2005 | Pode | H01M 10/625 62/3.61 |
| 8,121,752 | B2 * | 2/2012 | Winterhalter | B64D 45/00 174/544 |
| 9,681,590 | B2 * | 6/2017 | Uchida | F01P 9/02 |
| 10,369,863 | B2 * | 8/2019 | Connell | F25B 43/006 |
| 10,481,652 | B2 * | 11/2019 | Rice | H05K 7/20927 |
| 10,532,401 | B2 * | 1/2020 | Ujiie | F28D 1/0476 |
| 10,569,615 | B2 * | 2/2020 | Wischnesky | B60H 1/00271 |
| 10,624,240 | B2 * | 4/2020 | Leigh | H01L 23/367 |
| 10,849,256 | B2 * | 11/2020 | Broglia | F25B 31/008 |
| 11,112,130 | B2 * | 9/2021 | Taniguchi | F24F 1/24 |
| 11,318,860 | B2 * | 5/2022 | Yuan | H01M 10/663 |
| 11,904,652 | B2 * | 2/2024 | Hoshino | B60H 1/00278 |
| 11,912,100 | B2 * | 2/2024 | Nicolas | B60H 1/00921 |
| 11,938,783 | B2 * | 3/2024 | Sugimura | F25B 41/20 |

FOREIGN PATENT DOCUMENTS

| | | |
|---|---|---|
| CN | 209607877 U | 11/2019 |
| CN | 113561852 A | 10/2021 |

* cited by examiner

COOLING SYSTEM FOR ELECTRIC VEHICLE ADAPTED FOR COOLING OF COMPONENTS OF VEHICLE

TECHNICAL FIELD

The present disclosure relates to the field of electric vehicles, in particular to an electric vehicle cooling system.

BACKGROUND

In order to provide a comfortable environment for the passengers, electric vehicles are usually equipped with an air-conditioning cooling system. The air conditioning cooling system typically includes a condenser, a first valve, an evaporator, and a compressor etc., connected in series. The refrigerant circulates in the air conditioning electric vehicle cooling system. Currently, the sole purpose of the air conditioning and refrigeration system of electric vehicles is to provide passengers with an environment of appropriate temperatures. However, the air conditioning and refrigeration system may be adapted for additional functions.

Therefore, improvement is desired.

SUMMARY OF THE DISCLOSURE

The embodiment of the present disclosure aims to provide an electric vehicle cooling system with additional functions.

The embodiment of the present disclosure provides an electric vehicle cooling system which includes a cooling loop and a cooling branch. The cooling loop includes a condenser, a first valve, an evaporator and a compressor etc. which are successively connected to form a loop. The cooling branch is disposed in parallel with the evaporator; wherein the cooling branch includes a cooling unit that is configured to be in contact with one or more components, such that the refrigerant flowing through the cooling unit evaporates to cool them.

The current electric vehicle cooling system adds a cooling branch including additional heat exchangers/pumps with a separate coolant e.g. water in the cooling loop. The cooling branch is in contact with a component such as a battery or an electric motor which generates heat, so that the electric vehicle cooling system can not only provide users with an environment of appropriate temperature through the cooling loop, but also cool those components. In the present disclosure such a complex coolant branch is not needed, we have a simple cooling branch, which can not only reduce the cost, but also improve the space utilization. Due to no need of pumps/heat exchangers and a separate coolant, the present disclosure can reduce the overall weight of the electric vehicle and the power consumption and improve the acceleration and driving speed. It can also be used to cool other electrical components such as high-power chips thanks to its high cooling capability with less delay compared with current coolant-cooled approaches.

In some embodiments, the cooling branch further comprises a second valve, an inlet of the second valve is connected to an outlet of the first valve, and an outlet of the second valve is connected to an inlet of a cooling unit.

In the electric vehicle cooling system of the above embodiment, the second valve can control the flow rate of the refrigerant into the cooling unit, so as to control the temperature of the cooling unit, so that the temperature of the cooling unit can be kept stable.

In some embodiments, the cooling unit comprises a cold plate and a cold pipe, the cold plate is configured to be in contact with the component, the cold pipe passes through the cold plate, the cold pipe is configured to contain and guide the refrigerant to flow, a first end of the cold pipe is connected to the first valve, and a second end of the cold pipe is connected to the compressor, the first end of the cold pipe is an inlet of the cold pipe, the second end of the cold pipe is an outlet of the cold pipe.

In the electric vehicle cooling system of the above embodiment, the refrigerant can transport the heat by evaporating along the cold plate and passing through the cold pipe.

In some embodiments, the cold pipe further comprises an entry portion, a cooling portion, and an outflow portion, the inlet of the cold pipe is disposed at the entry portion, the entry portion is connected to the outlet of the second valve; the cooling portion is located in the cold plate and connected to the entry portion, and a shape of the cooling portion is wave-like; and a first end of the outflow portion is connected to the cooling portion, and the outlet of the cold pipe is located at a second end of the outflow portion and connected to the compressor.

In the electric vehicle cooling system of the above embodiment, the shape of the cooling portion is wave-like, such shape increases the contact area between the cooling portion and the cold plate, so as to improve the cooling speed of the cold plate.

In some embodiments, the cold plate further comprises a plate body and an insulation shell. The plate body is enclosed by an insulation shell to block heat exchange between outside and the plate body. The plate body is in contact with the component through a thermal interface material, and the cold pipe penetrates the insulation shell and the plate body that is soldered with the pipe with a good thermal contact interface in between. The insulation shell can be opened to allow service or replacement of to-be-cooled components e.g. high power chips-on-board.

In the electric vehicle cooling system of the above embodiment, the plate body is enclosed by an insulation shell, which can effectively block the heat exchange of the plate body and reduce the loss of cooling capacity of the plate body.

In some embodiments, an air gap is defined between the insulation shell and the plate body.

In the electric vehicle cooling system of the above embodiment, there is an air gap between the insulation shell and the plate body. Such space further reduces heat exchange and further reduces the loss of cooling capacity of the plate body.

In some embodiments, a material of the insulation shell is plastic, and a material of the plate body and the cold pipe is copper.

In the electric vehicle cooling system of the above embodiment, the plastic provides better insulation, while copper has good heat conduction, the plate body and cold pipe are made of copper, which can quickly cool down when the refrigerant passes through the plate, and the insulation shell can effectively prevent the loss of cooling capacity of the plate body.

In some embodiments, the cooling loop further comprises a third valve, the third valve is located between the first valve and the evaporator and is disposed in parallel with the cooling branch.

In the electric vehicle cooling system of the above embodiment, the third valve can control the flow rate of the refrigerant through the evaporator, so that when the air conditioner is not needed (for example in winter), the refrigerant can be blocked from passing through the evaporator by the third valve, while the temperature of the component can still be reduced without using the air conditioner for the cab.

In some embodiments, the cooling unit further comprises an insulation sleeve, the insulation sleeve is disposed on the cold pipe to prevent coldness loss.

In the electric vehicle cooling system of the above embodiment, the insulation sleeve can prevent coldness loss.

In some embodiments, the second valve is a temperature control valve, the second valve is configured to detect temperature of the cooling unit and accordingly adjust the flow rate of the refrigerant entering the cooling unit to maintain a constant case temperature of the cooling unit.

The present disclosure detects the temperature of the cooling unit through the second valve, which can keep the case temperature of the cooling unit constant by optimizing the flow rate, so as to improve the cooling effect of the cooling unit.

The electric vehicle cooling system of the present disclosure adds a cooling branch in the cooling loop, so that the electric vehicle cooling system can not only provide users with an appropriate temperature environment, but also cool a component. Compared with the independent addition of a loop to cool a component, the present disclosure can not only save space and reduce costs, but also reduce the weight of the electric vehicle, so as to improve the acceleration of the electric vehicle, and the electric vehicle consumes less power at the same speed, so as to prolong the driving distance.

DETAILED DESCRIPTION

The technical solutions in the embodiments of the present disclosure will be described in conjunction with the accompanying drawings in the embodiments of the present disclosure. Obviously, the described embodiments are part of the embodiments of the present disclosure, not all of them. Based on the embodiments of the present disclosure, all other embodiments obtained by those of ordinary skill in the art without creative work shall fall within the protection scope of the present disclosure.

It should be noted that when a component is considered to "connect" another component, it can be directly connected to another component or there may be intermediate components at the same time. When a component is considered to be "disposed" on another component, it can be disposed directly on another component or there may be centered components at the same time. The terms "top", "bottom", "top", "bottom", "left", "right", "front", "back" and similar expressions used in this paper are for illustrative purposes only.

The present disclosure provides an electric vehicle cooling system, the electric vehicle cooling system includes a cooling loop, a cooling branch, and a refrigerant. The cooling loop includes a condenser, a first valve, an evaporator, and a compressor which are successively connected to form a loop. The cooling branch is disposed in parallel with the evaporator; wherein the cooling branch includes a cooling unit, the cooling unit is configured to be in contact with a component, the refrigerant is configured to flow through the cooling unit and cool the component. The electric vehicle cooling system can add a cooling branch in parallel with the evaporator in the cooling loop, the cooling branch is in contact with the component, so that the electric vehicle cooling system not only provides users with an environment of appropriate temperature through the main cooling loop, but also cools the component through the other parallel loop, so that the electric vehicle cooling system has a dual effect. In the present disclosure, a traditional loop containing heat exchanger & pump with a separate coolant to cool the component is not needed, which can not only reduce the cost, but also improve the space utilization.

Figure 1:
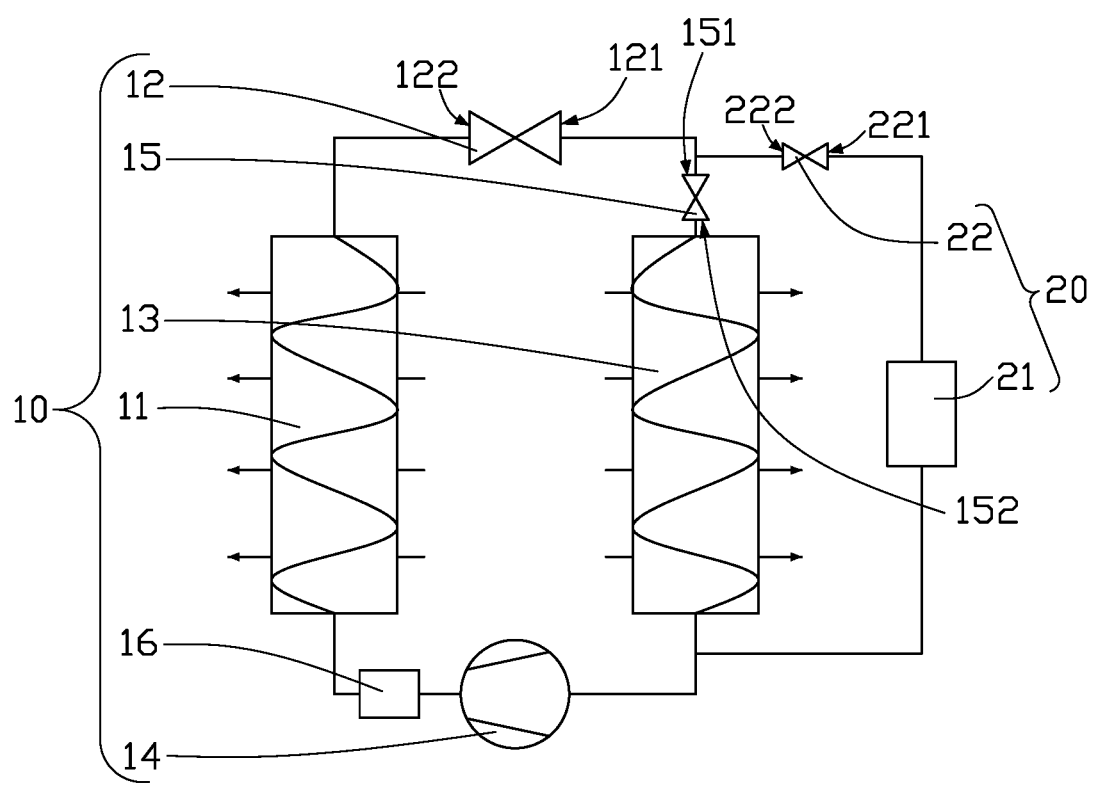
FIG. 1 is a schematic diagram of an electric vehicle cooling system according to an embodiment of the present disclosure.

FIG. 1 illustrates an electric vehicle cooling system 100 in accordance with an embodiment of the present disclosure.

The electric vehicle cooling system 100 includes a cooling loop 10 and a cooling branch 20. The cooling loop 10 includes a condenser 11, a first valve 12, an evaporator 13, and a compressor 14. The condenser 11, the first valve 12, the evaporator 13, and the compressor 14 are connected in that order, and each has an inlet and an outlet to form a loop. The electric vehicle cooling system 100 includes further includes a refrigerant 40 (shown in FIG. 2). A refrigerant is disposed in the cooling loop 10. The compressor 14 compresses the refrigerant from a low temperature and pressure gaseous state to a high temperature and pressure gaseous state after absorbing heat, then transporting it to the condenser 11 for cooling. After passing through the condenser 11, the refrigerant 40 becomes a liquid with normal temperature and high pressure, enters the first valve 12 to depressurize to form a gas-liquid mixture with low temperature and low pressure, and then enters the evaporator 13 to make the liquid refrigerant evaporate and absorb heat to turn into a gaseous state and then return to the compressor 14.

The cooling branch 20 is disposed in parallel with the evaporator 13. The cooling branch 20 includes a cooling unit 21, the inlet of the cooling unit 21 is communicating with the first valve 12, and the outlet of the cooling unit 21 is communicating with the compressor 14. The cooling unit 21 is used to contact and cool the component 30 (shown in FIG. 2). After passing through the first valve 12, part of the refrigerant 40 flows into the evaporator 13 and the other part of the refrigerant 40 into the cooling unit 21, so that the cooling unit 21 can maintain a low temperature. The refrigerant 40 from the cooling unit 21, after absorbing heat, forms a gaseous state, so that the compressor 14 can operate stably.

In some embodiments, the cooling loop 10 may be an air conditioning cooling loop. The electric vehicle cooling system 100 can not only adjust the temperature in the cab of the vehicle, but also cool the component 30 of the electric vehicle through the cooling branch 20.

In some embodiments, the electric vehicle may be an intelligent electric vehicle, and the component 30 may be the chip of the intelligent electric vehicle. The chip in the intelligent electric vehicle might be used to obtain images and data in real time from cameras or sensors of the intelligent electric vehicle. When in operation, the chip will generate a lot of heat. Too high a temperature of the chip will affect the data transmission and the response rate of programs in intelligent electric vehicles. Cooling the chip by the cooling branch 20 is conducive to keeping the chip in an efficient working state.

In some embodiments, the first valve 12 may be a thermal expansion valve, the thermal expansion valve can detect overheating of the refrigerant before its entering the compressor 14 and adjust the flow rate of the refrigerant into the compressor 14, so as to manage the overheating status of vapor and make the compressor 14 operate stably.

In some embodiments, the compressor 14 may be a variable frequency compressor. The present disclosure can change the power of the variable frequency compressor by changing the speed of the variable frequency compressor. Compared with the compressor with constant relative speed, the variable frequency compressor can change the power according to the needs of users and reduce energy consumption.

The cooling loop 10 is used to adjust the temperature of the cab in the electric vehicle. The cooling branch 20 is used to cool the component 30 of the electric vehicle, such as the chip of the intelligent electric vehicle, so that the electric vehicle cooling system 100 has dual functions, improves the utilization rate of the electric vehicle cooling system 100, and does not need to use a separate electric vehicle cooling system 100 to cool the component 30, so as to reduce the cost and save space.

Figure 2:
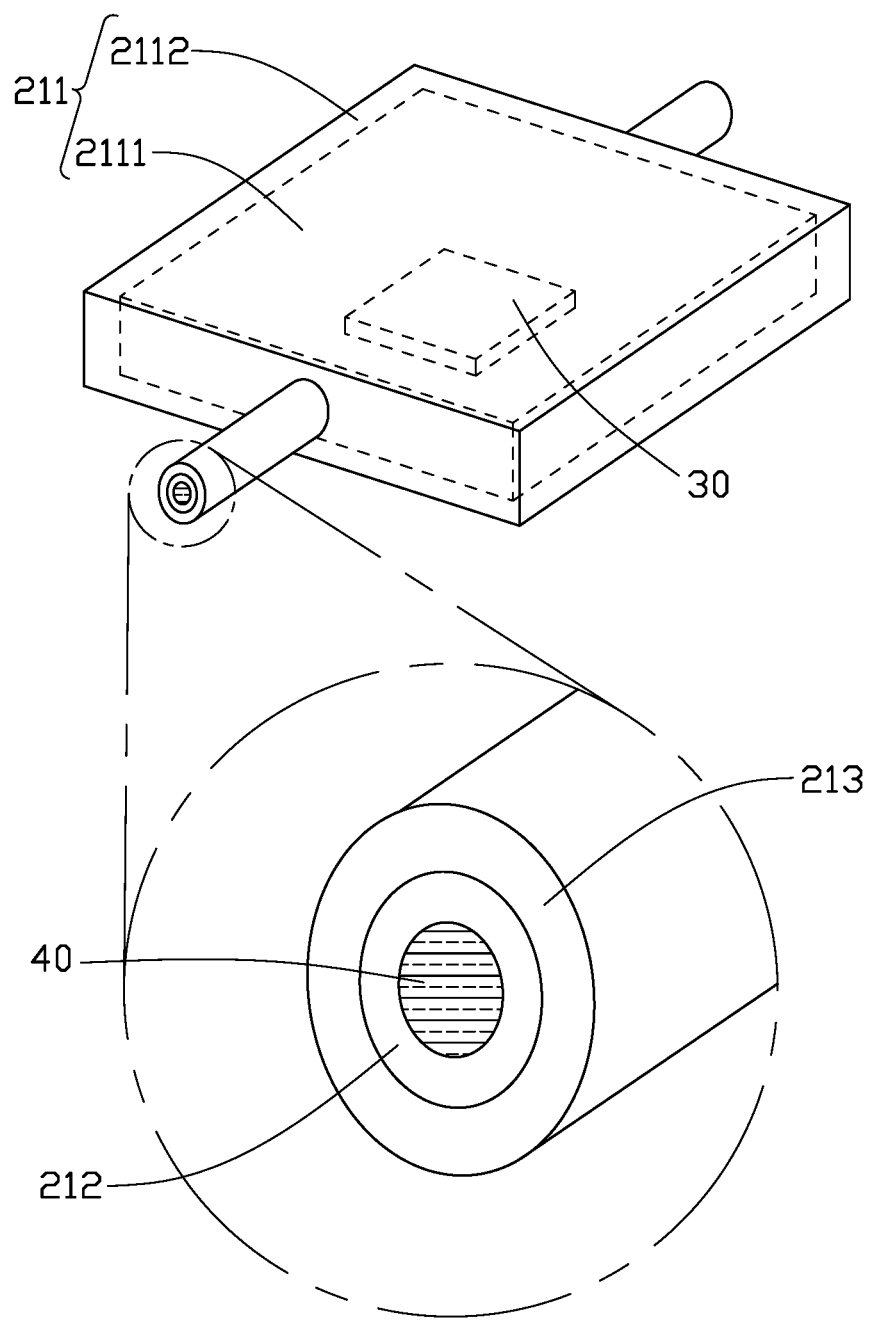
FIG. 2 is a schematic diagram of a cooling unit of the system in FIG. 1.
Figure 3:
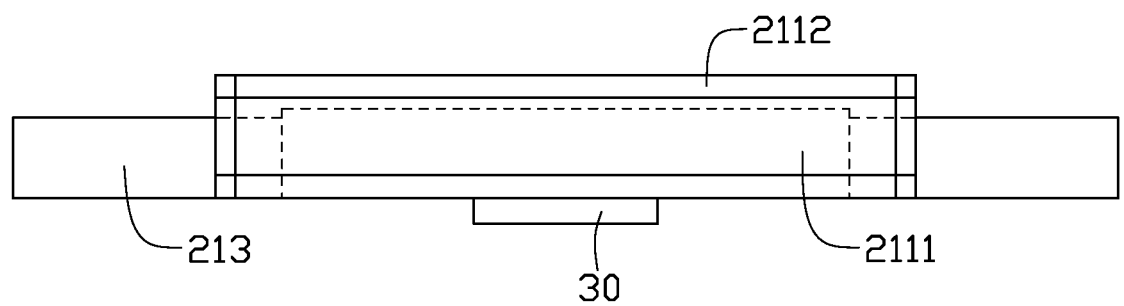
FIG. 3 is a side view of the cooling unit in FIG. 2.

Referring to FIG. 2 and FIG. 3, the cooling unit 21 includes a cold plate 211 and a cold pipe 212. The cold pipe 212 penetrates the cold plate 211, the cold plate 211 is in contact with the component 30 through a thermal interface material. One end of the cold pipe 212 is an inlet and connected with the first valve 12, and the other end of the cold pipe 212 is an outlet and connected with the compressor 14. The refrigerant 40 enters from the inlet of the cold pipe 212 and keeps the cold plate 211 at a low temperature by evaporation through the cold pipe 212. The cold plate 211 contacts the component 30 and continues to cool the component 30.

In some embodiments, there are multiple cold plates 211, and the cold plates 211 are connected in series with each other, and the position, shape and size of the cold plate 211 are adjusted according to the position of the component 30.

It can be understood that the cold plates 211 are not limited to being connected in series, but can also be connected in parallel.

The cold plate 211 includes a plate body 2111 and an insulation shell 2112. The insulation shell 2112 covers the plate body 2111 with an air gap in between, and the cold pipe 212 penetrates the insulation shell 2112 and the plate body 2111 at the same time. The insulation shell 2112 is used to block heat exchange of the plate body 2111 and prolong a low temperature of the plate body 2111.

In some embodiments, one inner surface of the insulation shell 2112 is fixed with the plate body 2111, and an air gap is reserved between other inner surfaces of the insulation shell 2112 and the plate body 2111. Compared with all the inner surfaces of the insulation shell 2112 in contact with the plate body 2111, heat exchange of the plate body 2111 is further blocked.

In some embodiments, the plate body 2111 is made of copper and has better thermal conductivity. When the refrigerant cools the plate body 2111 through the cold pipe 212, the temperature of the plate body 2111 can be quickly reduced.

It can be understood that the material of the plate body 2111 is not limited to copper, but can also be other materials with strong thermal conductivity, such as aluminum or aluminum copper alloy to save weight and cost.

In some embodiments, the material of the insulation shell 2112 is plastic, which can effectively block the heat exchange of the plate body 2111.

It can be understood that the material of the insulation shell 2112 is not limited to this, but can also be glass and other materials.

In one embodiment, the outer surface of the insulation shell can be further sleeved by an insulation material, e.g. insulation cotton to further prevent coldness loss.

Figure 4:
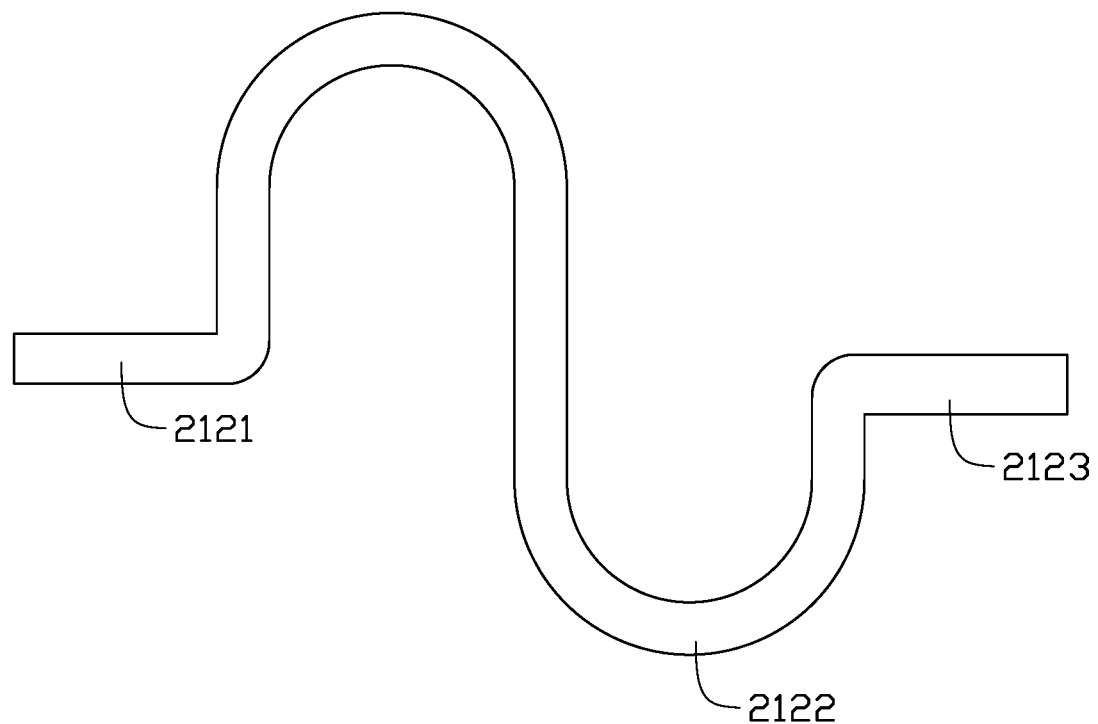
FIG. 4 is a top view of a cold pipe of the system in FIG. 1.

Referring to FIG. 4, the cold pipe 212 includes an entry portion 2121, a cooling portion 2122, and an outflow portion 2123. The inlet of the cold pipe 212 is located at one end of the entry portion 2121, and the other end of the entry portion 2121 is connected to the cooling portion 2122. The cooling portion 2122 is disposed in the plate body 2111, and one end of the cooling portion 2122 away from the entry portion 2121 is connected to the outflow portion 2123. The outlet of the cold pipe 212 is located at one end of the outflow portion 2123 away from the cooling portion 2122.

In some embodiments, the shape of the cooling portion 2122 is wave-like, which can increase the contact area with the plate body 2111, so as to better reduce the temperature of the plate body 2111.

It can be understood that the shape of the cooling portion 2122 is not limited to a wave shape, but can also be other shapes, such as a broken line shape.

In some embodiments, the material of the cold pipe 212 is copper, which has better thermal conductivity and can quickly transfer heat to or from the plate body 2111.

It can be understood that the material of the cold pipe 212 is not limited to copper, but can also be silver, aluminum, aluminum copper alloy, and other materials.

Referring to FIG. 2, in some embodiments, the cooling unit 21 further includes an insulation sleeve 213. The insulation sleeve 213 is sleeved on the cold pipe 212, the insulation sleeve 213 can block the heat exchange between the cold pipe 212 and outside, so as to reduce the loss of cooling capacity and save energy.

In some embodiments, the material of the insulation sleeve 213 is insulating material, such as insulating cotton.

Referring to FIG. 1 and FIG. 2, in some embodiments, the cooling branch 20 further incudes a second valve 22. The second valve 22 is disposed in parallel with the evaporator 13, and the inlet 222 of the second valve 22 is connected to the outlet 121 of the first valve 12. The inlet 122 of the first valve 12 is connected to the condenser 11. The outlet 221 of the second valve 22 is connected to the inlet of the cooling unit 21. The second valve 22 is used to adjust the flow of refrigerant entering the plate body 2111, so as to control the temperature of the plate body 2111.

In some embodiments, the second valve 22 is a temperature control valve that automatically adjusts the flow of refrigerant by detecting the temperature of the plate body 2111. The present disclosure can achieve the purpose of saving energy by entirely gasifying the refrigerant at the outflow portion 2123, so as to minimize the needed flow, the plate body 2111 can maintain a constant temperature and not allow the temperature of the plate body 2111 to be too high for effective cooling of the component 30, or the temperature of the plate body 2111 being too low, resulting in waste of resources.

In some embodiments, the cooling loop 10 further includes a third valve 15, the third valve 15 is disposed between the first valve 12 and the evaporator 13 and is disposed in parallel with the cooling branch 20. The inlet 151 of the third valve 15 is connected to the outlet 121 of the first valve 12, the outlet 152 is connected to the evaporator 13. The third valve 15 is used to control the flow of refrigerant into the evaporator 13. Thus, the component 30 of the electric vehicle can still be cooled in winter when air conditioning for the cab of the vehicle is not required.

In some embodiments, the third valve 15 is a solenoid valve with signal feedback, which can adjust the refrigerant flow according to the needs of users.

In some embodiments, the cooling loop 10 further includes a receiver drier 16, the receiver drier 16 is located between the compressor 14 and the condenser 11, the receiver drier 16 is used for drying the refrigerant.

The electric vehicle cooling system 100 of the embodiment of the present disclosure can not only provide the user with appropriate temperature environment through the cooling loop 10, but also cool the chip and other components through the cooling branch 20, and the chip and other components do not need to establish a new or dedicated cooling system, which can not only save cost and space, but also reduce the overall weight of the electric vehicle. After the overall weight of the electric vehicle is reduced, it can not only improve the acceleration of the electric vehicle, but also reduce the power consumption and prolong the driving distance of the electric vehicle.

The existing water-cooling system needs additional heat exchangers and pumps to cool components such as batteries. The electric vehicle cooling system 100 of the present disclosure is cooled by refrigerant phase change, the thermal resistance of which is smaller than that of the water-cooled cooling system and the temperature of the refrigerant flowing into the cold plate 211 is typically much lower than that in water-cooled cooling system thanks to a very low temperature of the refrigerant before its entering the evaporator. As a result, the electric vehicle cooling system 100 is able to cool a component with less delay than current practice.

Those of ordinary skill in the art should realize that the above embodiments are only used to illustrate the present disclosure, but not to limit the present disclosure. As long as they are within the essential spirit of the present disclosure, the above embodiments are appropriately made and changes fall within the scope of protection of the present disclosure.

What is claimed is:

1. An electric vehicle cooling system comprising:
   a cooling loop comprising a condenser, a first valve, an evaporator and a compressor which are successively connected to form a loop; and
   a cooling branch disposed in parallel with the evaporator;
      wherein the cooling branch comprises a cooling unit, the cooling unit is profiled to contact with a component of the electric vehicle;
   wherein the cooling unit is configured to receive refrigerant and cool the component;
   wherein the cooling unit comprises a cold plate and a cold pipe, the cold plate is profiled to contact with the component, the cold plate further comprises a plate body and an insulation shell, the plate body is enclosed by the insulation shell to block heat exchange between the plate body and outside to save energy, the plate body is in contact with the component through a thermal interface material, the cold pipe penetrates the plate body and the insulation shell, and an air gap is defined between the insulation shell and the plate body;
   wherein the cooling loop is configured to adjust a temperature of the electric vehicle, the cooling branch is configured to cool the component of the electric vehicle; the cooling loop further comprises a receiver drier located between the compressor and the condenser, the receiver drier is configured for drying the refrigerant;
   wherein the cooling loop further comprises a third valve, the third valve is located between the first valve and the evaporator and is disposed in parallel with the cooling branch, the third valve is a solenoid valve with signal feedback, and the third valve is configured to control a flow rate of the refrigerant through the evaporator;
   wherein the cooling branch further comprises a second valve, an inlet of the second valve is connected to an outlet of the first valve, and an outlet of the second valve is connected to an inlet of the cooling unit, the cold pipe is soldered with the cold plate, the cold pipe penetrates the cold plate, the cold pipe is configured to contain and guide the refrigerant to flow, a first end of the cold pipe is connected to the first valve, and a second end of the cold pipe is connected to the compressor, the first end of the cold pipe is an inlet of the cold pipe, the second end of the cold pipe is an outlet of the cold pipe.

2. The electric vehicle cooling system of claim 1, wherein the cold pipe further comprises an entry portion, a cooling portion, and an outflow portion, the inlet of the cold pipe is disposed at the entry portion, the entry portion is connected to the outlet of the second valve; the cooling portion is located in the cold plate and connected to the entry portion, and a shape of the cooling portion is wavy; and a first end of the outflow portion is connected to the cooling portion, and the outlet of the cold pipe is located at a second end of the outflow portion and connected to the compressor.

3. The electric vehicle cooling system of claim 2, wherein a material of the insulation shell is plastic, and a material of the plate body and the cold pipe is copper.

4. An electric vehicle cooling system comprising:
   a cooling loop comprising a condenser, a first valve, an evaporator and a compressor which are successively connected to form a loop; and
   a cooling branch disposed in parallel with the evaporator;
      wherein the cooling branch comprises a cooling unit, the cooling unit is profiled to contact with a component with a thermal interfacial material in between; and
      wherein the cooling unit is configured to receive refrigerant and cool the component;
   a cold plate profiled to contact with the component;
   a cold pipe profiled to contain and guide the refrigerant to flow, wherein the cold pipe is soldered with the cold plate, and the cold pipe penetrates the cold plate;
   wherein the cold plate is profiled to contact with the component, the cold plate further comprises a plate body and an insulation shell, the plate body is enclosed by the insulation shell to block heat exchange between the plate body and outside to save energy, the plate body is in contact with the component through a thermal interface material, the cold pipe penetrates the plate body and the insulation shell, an outer surface of the insulation shell is sleeved by an insulation material, and an air gap is defined between the insulation shell and the plate body;
   wherein the cooling loop is configured to adjust a temperature of the electric vehicle, the cooling branch is configured to cool the component of the electric vehicle; the cooling loop further comprises a receiver drier located between the compressor and the condenser, the receiver drier is configured for drying the refrigerant;
   wherein the cooling loop further comprises a third valve, the third valve is located between the first valve and the evaporator and is disposed in parallel with the cooling branch, the third valve is a solenoid valve with signal feedback, and the third valve is configured to control a flow rate of the refrigerant through the evaporator;

wherein the cooling branch further comprises a second valve, an inlet of the second valve is connected to an outlet of the first valve, and an outlet of the second valve is connected to an inlet of the cooling unit, a first end of the cold pipe is connected to the first valve, and a second end of the cold pipe is connected to the compressor, the first end of the cold pipe is an inlet of the cold pipe, the second end of the cold pipe is an outlet of the cold pipe.

5. The electric vehicle cooling system of claim 4, wherein the cold pipe further comprises an entry portion, a cooling portion, and an outflow portion, the inlet of the cold pipe is disposed at the entry portion, the entry portion is connected to the outlet of the second valve; the cooling portion is located in the cold plate and connected to the entry portion, and a shape of the cooling portion is wavy; and a first end of the outflow portion is connected to the cooling portion, and the outlet of the cold pipe is located at a second end of the outflow portion and connected to the compressor.

6. The electric vehicle cooling system of claim 5, wherein a material of the insulation shell is plastic, and a material of the plate body and the cold pipe is copper.

* * * * *